United States Patent
Kawagoshi (10) Patent No.: US 7,084,697 B2
(45) Date of Patent: Aug. 1, 2006

(54) CHARGE PUMP CIRCUIT CAPABLE OF COMPLETELY CUTTING OFF PARASITIC TRANSISTORS

(75) Inventor: Hirokazu Kawagoshi, Ohtsu (JP)

(73) Assignee: NEC Electronics Corporation, Kanagawa (JP)

( * ) Notice: Subject to any disclaimer, the term of this patent is extended or adjusted under 35 U.S.C. 154(b) by 79 days.

(21) Appl. No.: 10/876,553

(22) Filed: Jun. 28, 2004

(65) Prior Publication Data

US 2005/0017792 A1    Jan. 27, 2005

(30) Foreign Application Priority Data

Jul. 23, 2003   (JP) ............................. 2003-278320
Dec. 16, 2003   (JP) ............................. 2003-417730

(51) Int. Cl.
*G05F 3/02*   (2006.01)
(52) U.S. Cl. ........................................ 327/536; 363/60
(58) Field of Classification Search ................ 327/536, 327/537; 363/60
See application file for complete search history.

(56) References Cited

U.S. PATENT DOCUMENTS

| | | | | |
|---|---|---|---|---|
| 6,020,778 A | * | 2/2000 | Shigehara et al. | 327/534 |
| 6,130,574 A | * | 10/2000 | Bloch et al. | 327/536 |
| 6,154,085 A | * | 11/2000 | Ramakrishnan | 327/404 |
| 6,194,952 B1 | * | 2/2001 | Shigehara | 327/534 |
| 6,424,203 B1 | * | 7/2002 | Bayadroun | 327/536 |
| 6,567,024 B1 | * | 5/2003 | Ishikawa | 341/136 |
| 6,677,806 B1 | * | 1/2004 | Bloch | 327/536 |
| 6,724,239 B1 | * | 4/2004 | Price et al. | 327/536 |
| 2005/0088220 A1 | * | 4/2005 | Hahn et al. | 327/536 |

FOREIGN PATENT DOCUMENTS

JP    2002-191168    7/2002

\* cited by examiner

*Primary Examiner*—Terry D. Cunningham
(74) *Attorney, Agent, or Firm*—Young & Thompson (57) ABSTRACT

In a charge pump circuit including a first charging switching element connected between an input voltage receiving terminal (IVRT) and a first terminal of a step-up capacitor, a second charging switching element connected between a second terminal of the step-up capacitor and a power supply terminal, a first discharging switching element connected between the IVRT and the second terminal of the step-up capacitor, and a second discharging switching element (DSE2) connected between the first terminal of the step-up capacitor and an output terminal, a first switch circuit is connected between the IVRT and a back gate of the first charging switching element and between the first terminal of the step-up capacitor and the back gate of the first charging switching element. A second switch circuit is connected between the first terminal of the step-up capacitor and back gate of DSE2 and between the output terminal and back gate of DSE2.

18 Claims, 9 Drawing Sheets

CHARGE PUMP CIRCUIT CAPABLE OF COMPLETELY CUTTING OFF PARASITIC TRANSISTORS

BACKGROUND OF THE INVENTION

1. Field of the Invention

The present invention relates to a charge pump circuit including P-channel MOS transistors.

2. Description of the Related Art

Generally, a charge pump circuit is constructed by first and second charging elements for charging a step-up capacitor and first and second discharging switching elements for discharging the step-up capacitor. In this case, each of the first charging switching element and the second discharging switching element is formed by a P-channel MOS transistor. Also, the second charging switching element is formed by an N-channel MOS transistor and the first discharging switching element is formed by a P-channel MOS transistor.

In the above-described prior art charge pump circuit, each of the P-channel MOS transistors of the first charging element and the second discharging switching element is inherently associated with a parasitic PNP-type transistor. As a result, when such P-channel MOS transistors are turned ON, the corresponding parasitic PNP-type transistors are also turned ON, so that invalid currents flow therethrough.

In a prior art charge pump circuit (see: JP-A-2002-191168), in order to suppress the above-mentioned invalid currents, resistors are connected to the back gates of the P-channel MOS transistors. This will be explained later in detail.

In the above-described charge pump circuit, however, since the invalid currents are not completely cut off, the efficiency of the charge pump circuit is still low.

SUMMARY OF THE INVENTION

It is an object of the present invention to provide a charge pump circuit having a high efficiency.

According to the present invention, in a charge pump circuit including a first charging switching element formed by a first P-channel MOS transistor connected between an input voltage receiving terminal and a first terminal of a step-up capacitor, a second charging switching element connected between a second terminal of the step-up capacitor and a power supply terminal, a first discharging switching element connected between the input voltage receiving terminal and the second terminal of the step-up capacitor, and a second discharging switching element formed by a second P-channel MOS transistor connected between the first terminal of the step-up capacitor and an output terminal, a first switch circuit is connected between the input voltage receiving terminal and a back gate of the first P-channel MOS transistor and between the first terminal of the step-up capacitor and the back gate of the first P-channel MOS transistor, and a second switch circuit is connected between the first terminal of the step-up capacitor and a back gate of the second P-channel MOS transistor and between the output terminal and the back gate of the second P-channel MOS transistor.

In a charging mode, when the first and second charging switching elements are turned ON, the first switch circuit electrically connects the back gate of the first P-channel MOS transistor to the input voltage receiving terminal and the second switch circuit electrically connects the back gate of the second P-channel MOS transistor to the output terminal.

In a discharging mode, when the first and second discharging switching elements are turned ON, the first switch circuit electrically connects the back gate of the first P-channel MOS transistor to the first terminal of the step-up capacitor and the second switch circuit electrically connects the back gate of the second P-channel MOS transistor to the first terminal of the step-up capacitor.

Thus, in each of parasitic PNP-type transistors inherently associated with the first and second P-channel MOS transistors, the base voltage is made equivalent to the emitter voltage, thus completely cutting OFF the parasitic PNP-type transistors.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, a prior art charge pump circuit will be explained with reference to FIG. 1 (see: JP-A-2002-191168).

Figure 1:
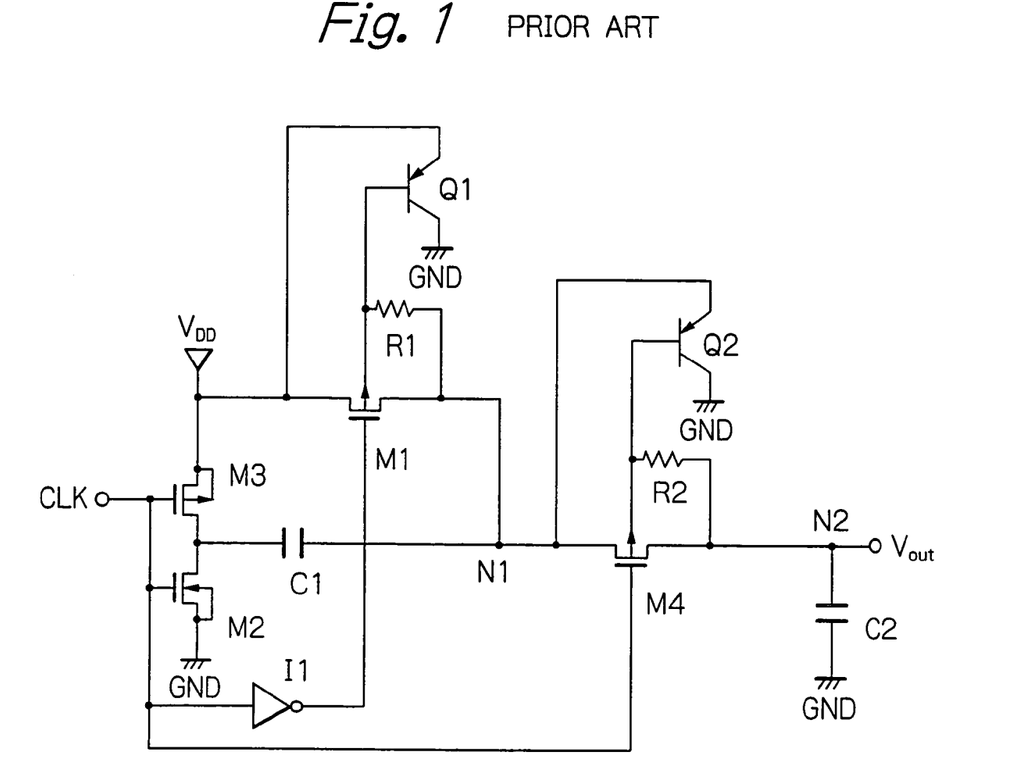
FIG. 1 is a circuit diagram illustrating a prior art charge pump circuit.

In FIG. 1, C1 and C2 designate a step-up capacitor and a smoothing capacitor, respectively.

In order to charge the step-up capacitor C1, a P-channel MOS transistor M1 is connected between a power supply terminal $V_{DD}$ as an input voltage receiving terminal and the step-up capacitor C1, and an N-channel MOS transistor M2 is connected between the step-up capacitor C1 and another power supply terminal which is in this case a ground terminal GND. That is, when the P-channel MOS transistor M1 and the N-channel MOS transistor M2 are turned ON by an inverted signal of a clock signal CLK via an inverter I1 and the clock signal CLK, respectively, the step-up capacitor C1 is charged, so that the voltage at a node N1 is increased. Thus, the P-channel MOS transistor M1 and the N-channel MOS transistor M2 are called charging switching transistors.

Also, in order to discharge the step-up capacitor C1 or step-up the voltage at the node N1, a P-channel MOS transistor M3 is connected between the power supply terminal $V_{DD}$ and the step-up capacitor C1, and a P-channel MOS transistor M4 is connected between the step-up capacitor C1 and a node N2 connected to the smoothing capacitor C2 for generating an output voltage $V_{out}$. That is, when the P-channel MOS transistors M3 and M4 are turned ON by the clock signal CLK, the step-up capacitor C1 is discharged, so that the voltage at the node N1 is increased or stepped up. Thus, the P-channel MOS transistors M3 and M4 are called discharging (step-up) switching elements.

Thus, the power supply voltage $V_{DD}$ as an input voltage is increased to a higher voltage such as $2 \cdot V_{DD}$ as the output voltage $V_{out}$.

The P-channel MOS transistor M1 is inherently associated with a parasitic PNP-type transistor Q1, and the P-channel MOS transistor M4 is inherently associated with a parasitic PNP-type transistor Q2. When the P-channel MOS transistor M1 is turned ON, the parasitic PNP-type transistor Q1 is also turned ON, so that an invalid current flows therethrough. In order to suppress this invalid current, a resistor R1 is connected between a back gate of the P-channel MOS transistor M1 and the node N1. Also, when the P-channel MOS transistor M4 is turned ON, the parasitic PNP-type transistor Q2 is also turned ON, so that an invalid current flows therethrough. In order to suppress this invalid current, a resistor R2 is connected between a back gate of the P-channel MOS transistor M4 and the node N2.

The operation of the charge pump circuit of FIG. 1 is explained next.

In a charging mode where the clock signal CLK is high (="1"), the MOS transistors M1 and M2 are turned ON, so that the step-up capacitor C1 is charged. If a time of the charging mode is sufficiently large, the voltage at the node N1 becomes $V_{DD}$. In this case, the parasitic PNP-type transistor Q1 is also turned ON; however, a base current of the parasitic PNP-type transistor Q1 is suppressed by the resistor R1, so that an invalid current flowing through the PNP-type transistor Q1 is suppressed.

In a discharging (step-up) mode where the clock signal CLK is low (="0"), the MOS transistors M3 and M4 are turned ON, so that the step-up capacitor C1 is discharged. As a result, the power supply voltage $V_{DD}$ is added to the voltage at the node N1 whose voltage is already $V_{DD}$, so that the voltage at the node N1 becomes $2 \cdot V_{DD}$. Even in this case, the parasitic PNP-type transistor Q2 is also turned ON; however, a base current of the parasitic PNP-type transistor Q2 is suppressed by the resistor R2, so that an invalid current flowing through the PNP-type transistor Q2 is suppressed.

In the charge pump circuit of FIG. 1, however, since the invalid currents flowing through the parasitic transistors Q1 and Q2 are not completely cut OFF, the efficiency of the charge pump circuit is still low.

Figure 2:
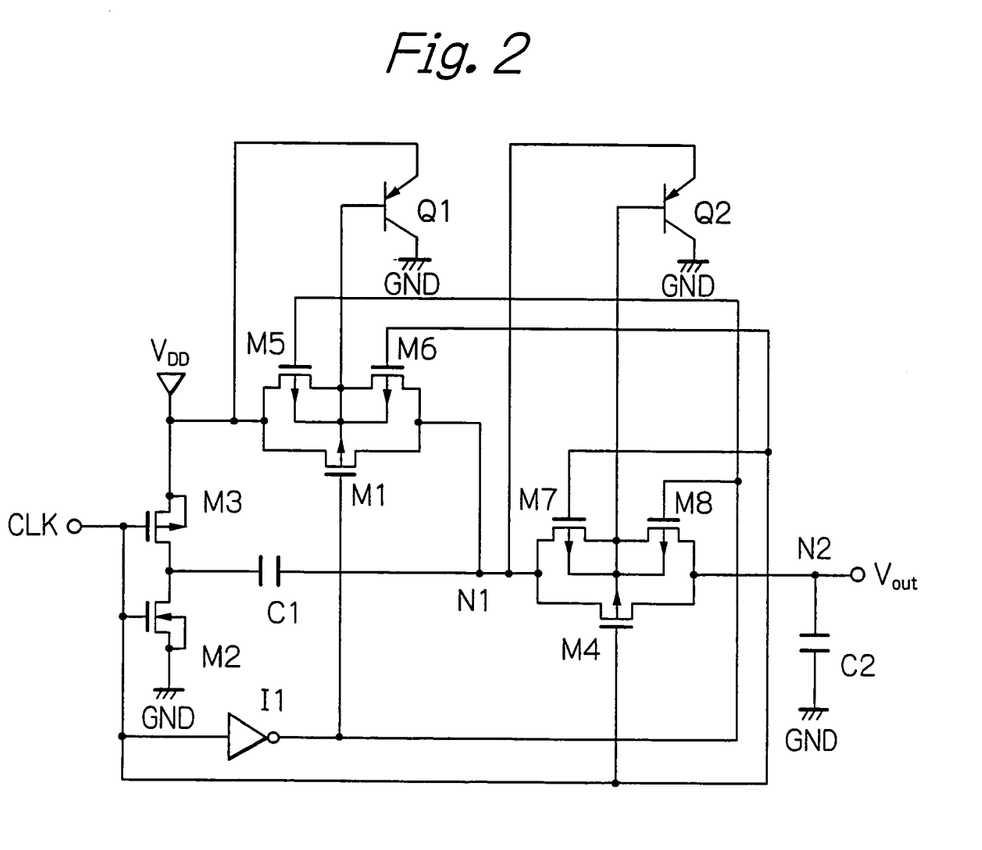
FIG. 2 is a circuit diagram illustrating a first embodiment of the charge pump circuit according to the present invention.

In FIG. 2, which illustrates a first embodiment of the charge pump circuit according to the present invention, complementary P-channel MOS transistors M5 and M6 are provided instead of the resistor R1 of FIG. 1, and complementary P-channel MOS transistors M7 and M8 are provided instead of the resistor R2 of FIG. 1.

In more detail, the P-channel MOS transistor M5 controlled by the inverted signal of the clock signal CLK is connected between the power supply terminal $V_{DD}$ and the back gate of the P-channel MOS transistor M1 (the base of the parasitic PNP-type transistor Q1). The P-channel MOS transistor M6 controlled by the clock signal CLK is connected between the node N1 and the back gate of the P-channel MOS transistor M1 (the base of the parasitic PNP-type transistor Q1). The P-channel MOS transistor M7 controlled by the clock signal CLK is connected between the node N1 and the back gate of the P-channel MOS transistor M4 (the base of the parasitic PNP-type transistor Q2). The P-channel MOS transistor M8 controlled by the inverted signal of the clock signal CLK is connected between the node N2 and the back gate of the P-channel MOS transistor M4 (the base of the parasitic PNP-type transistor Q2).

The operation of the charge pump circuit of FIG. 2 is explained next with reference to FIGS. 3 and 4.

Figure 3:
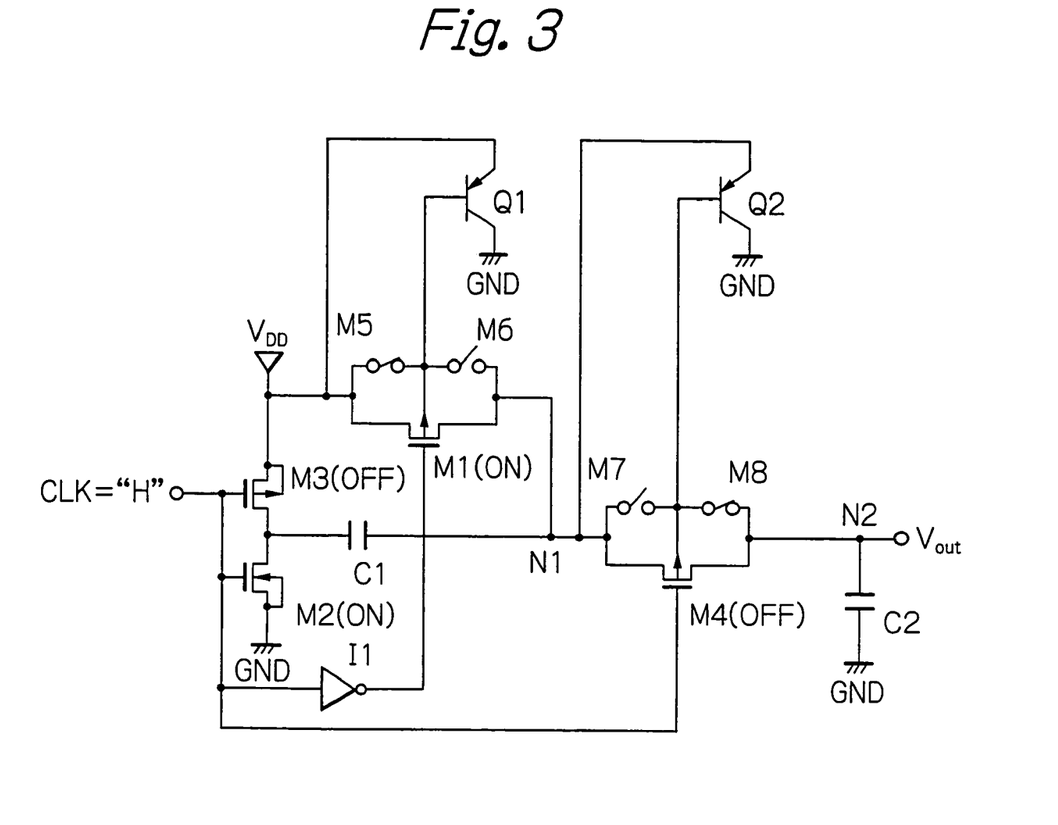
FIG. 3 is a circuit diagram for explaining the charging operation of the charge pump circuit of FIG. 2.

In a charging mode where the clock signal CLK is high (="1") as shown in FIG. 3, the MOS transistors M1 and M2 are turned ON, so that the step-up capacitor C1 is charged. If a time of the charging mode is sufficiently large, the voltage at the node N1 becomes $V_{DD}$. In this case, since the P-channel MOS transistors M5 and M6 are turned ON and OFF, respectively, so that the voltage at the base of the parasitic PNP-type transistor Q1 is made equivalent to the voltage at the emitter thereof, the parasitic PNP-type transistor Q1 is turned OFF. Also, since the P-channel MOS transistors M7 and M8 are turned OFF and ON, respectively, no reverse current flows therethrough.

Figure 4:
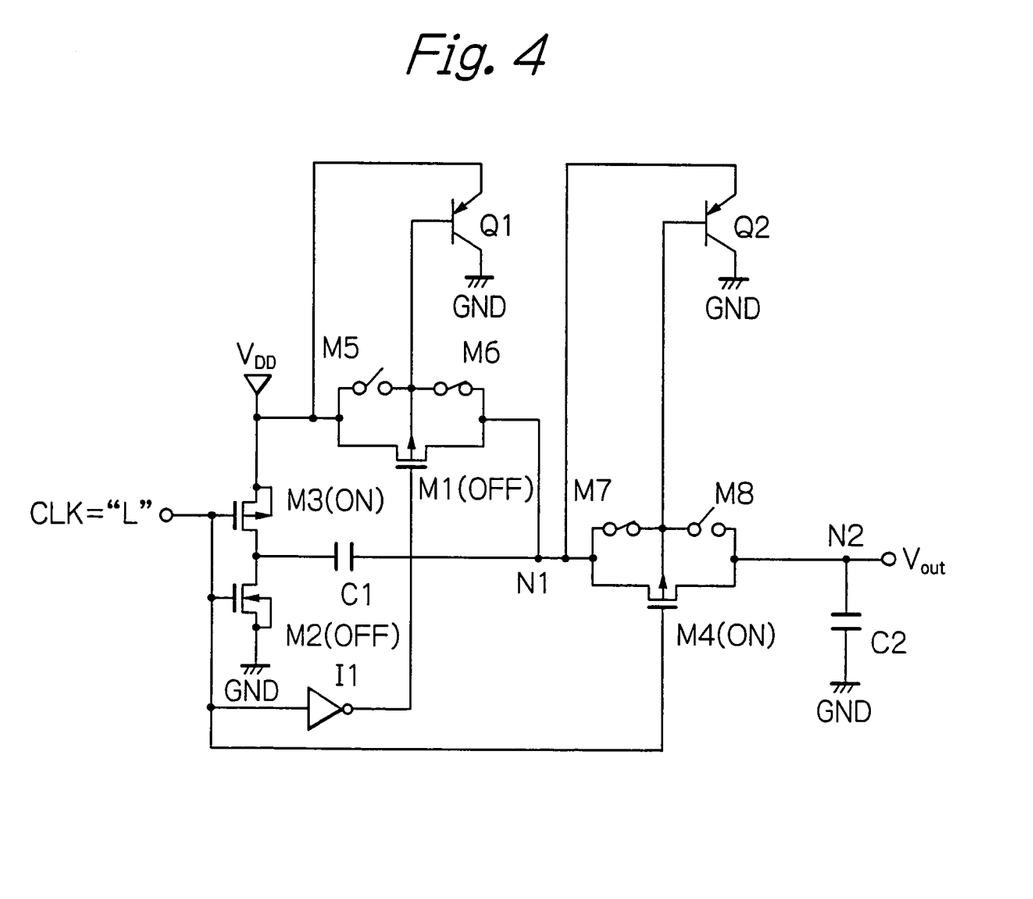
FIG. 4 is a circuit diagram for explaining the discharging (step-up) operation of the charge pump circuit of FIG. 2.

In a discharging(step-up) mode where the clock signal CLK is low (="0") as shown in FIG. 4, the MOS transistors M3 and M4 are turned ON, so that the step-up capacitor C1 is discharged. In this case, since the P-channel MOS transistors M7 and M8 are turned OFF and ON, respectively, so that the voltage at the base of the parasitic PNP-type transistor Q2 is made equivalent to the voltage at the emitter thereof, the parasitic PNP-type transistor Q2 is turned OFF. Also, since the P-channel MOS transistors M5 and M6 are turned OFF and ON, respectively, no reverse current flows therethrough.

In a charging operation mode as shown in FIG. 3, if the output voltage $V_{out}$ at the node N2 is made lower than the voltage at the node N1 by the fluctuation of a load (not shown) connected to the node N2, the base voltage of the parasitic PNP-type transistor Q2 is made lower than the emitter voltage thereof, so that the parasitic PNP-type transistor Q2 is turned ON. Thus, an invalid current flows through the parasitic PNP-type transistor Q2.

On the other hand, in a discharging operation mode as shown in FIG. 4, even if the output voltage $V_{out}$ at the node N2 is made lower than the voltage at the node N1 by the fluctuation of the load, the base voltage of the parasitic PNP-type transistor Q2 is made equivalent to the emitter voltage thereof by the turned-ON P-channel MOS transistor M7, the parasitic PNP-type transistor Q2 is never turned ON.

Figure 5:
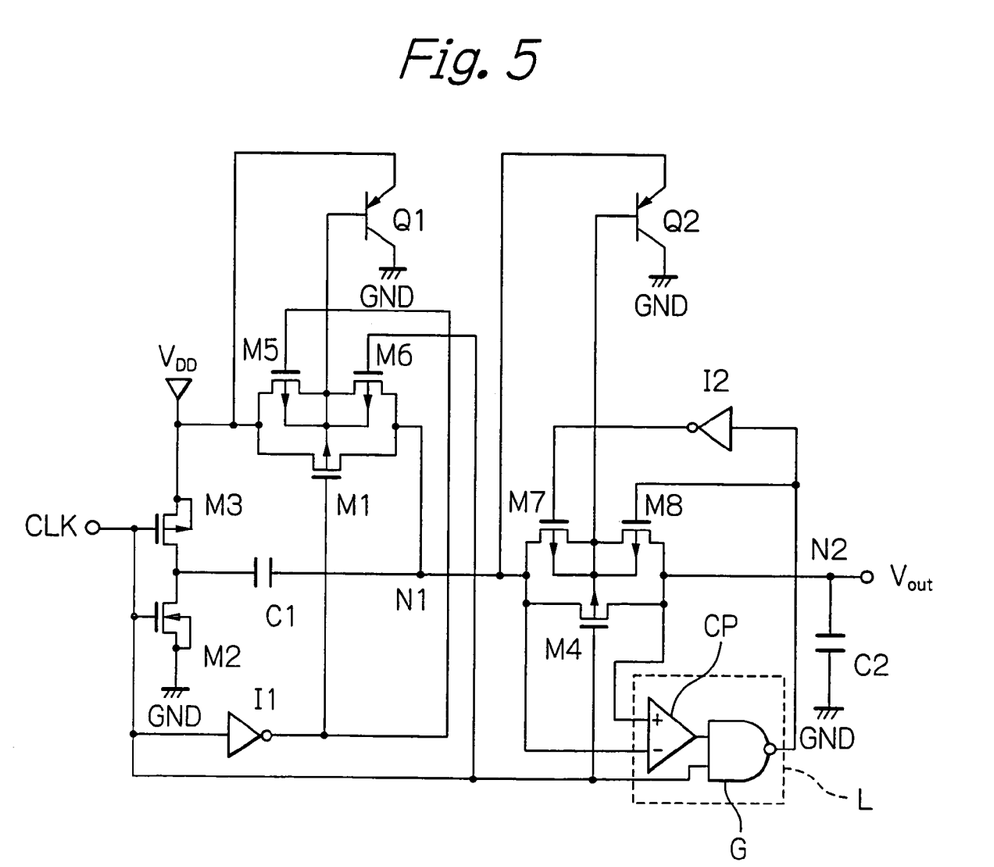
FIG. 5 is a circuit diagram illustrating a second embodiment of the charge pump circuit according to the present invention.

In FIG. 5, which illustrates a second embodiment of the charge pump circuit according to the present invention, a logic circuit L formed by a comparator CP and an NAND circuit G, and an inverter IN2 are added to the elements of FIG. 5.

The comparator CP compares the voltage at the node N1 with the output voltage $V_{out}$ at the node N2. As a result, when the output voltage $V_{out}$ at the node N2 is not lower than the voltage at the node N1, the output signal of the comparator CP is high (="1"). On the other hand, when the output voltage $V_{out}$ at the node N2 is lower than the voltage at the node N1, the output signal of the comparator CP is low (="0").

The output signal of the comparator CP and the clock signal CLK are supplied to the NAND circuit G. The output signal of the logic circuit L, which is the output signal of the NAND circuit G, is supplied via the inverter 12 to the gate of the P-channel MOS transistor M7, and is supplied directly to the gate of the P-channel MOS transistor M8.

The operation of the charge pump circuit of FIG. 5 is explained next with reference to FIGS. 6A, 6B and 7.

Figure 6A:
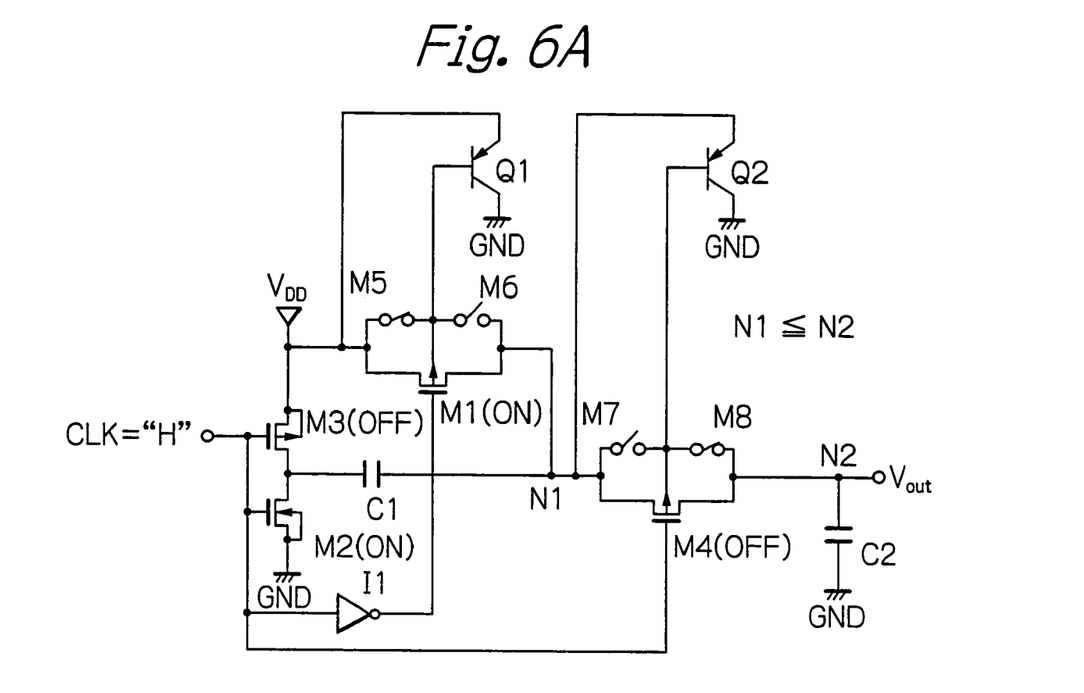
FIGS. 6A and 6B are circuit diagrams for explaining the charging operation of the charge pump circuit of FIG. 5.
Figure 6B:
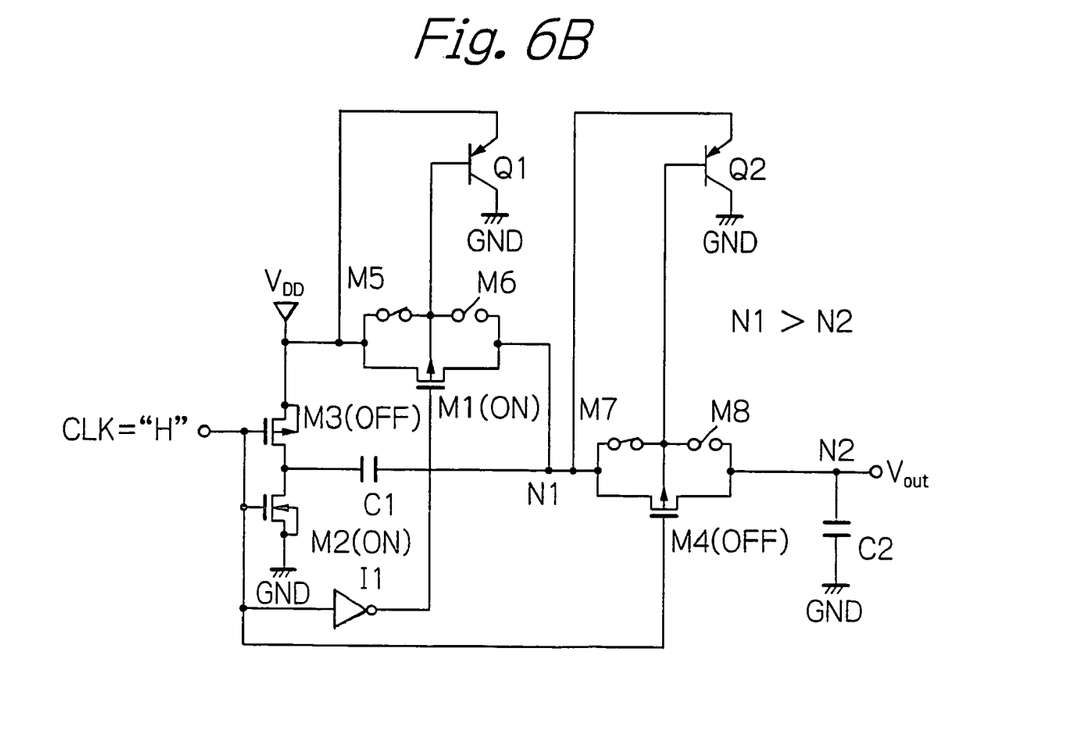

In a charging mode where the clock signal CLK is high (="1") as shown in FIGS. 6A and 6B, the MOS transistors M1 and M2 are turned ON, so that the step-up capacitor C1 is charged. If a time of the charging mode is sufficiently large, the voltage at the node N1 becomes $V_{DD}$. In this case, since the P-channel MOS transistors M5 and M6 are turned ON and OFF, respectively, so that the voltage at the base of the parasitic PNP-type transistor Q1 is made equivalent to the voltage at the emitter thereof, the parasitic PNP-type transistor Q1 is turned OFF. Thus, no invalid current flows through the parasitic PNP-type transistor Q1.

Also, since the P-channel MOS transistors M6 is turned OFF, no reverse current flows therethrough.

Further, when the output voltage $V_{out}$ at the node N2 is not lower than the voltage at the node N1, the output signal of the logic circuit L is low (="0"). As a result, the clock signal CLK (="1") is supplied to the gate of the P-channel transistor M7 so that the P-channel transistor M7 is turned OFF as shown in FIG. 6A. Simultaneously, the inverted signal (="0") of the clock signal CLK is supplied to the gate of the P-channel transistor M8 so that the P-channel transistor M8 is turned ON as shown in FIG. 6A. Therefore, since the base voltage of the parasitic PNP-type transistor Q2 (the output voltage $V_{out}$) is not lower than the emitter voltage thereof (the voltage at the node N1), the parasitic PNP-type transistor Q2 is turned OFF, so that no invalid current flows therethrough.

On the other hand, when the output voltage $V_{out}$ at the node N2 is lower than the voltage at the node N1, the output signal of the logic circuit L is high (="1"). As a result, the inverted signal (="0") of the clock signal CLK is supplied to the gate of the P-channel transistor M7 so that the P-channel transistor M7 is turned ON as shown in FIG. 6B. Simultaneously, the clock signal CLK (="1") is supplied to the gate of the P-channel transistor M8 so that the P-channel transistor M8 is turned OFF as shown in FIG. 6B. Therefore, since the base voltage of the parasitic PNP-type transistor Q2 is made equivalent to the emitter voltage thereof (the voltage at the node N1), the parasitic PNP-type transistor Q2 is turned OFF, so that no invalid current flows therethrough.

Note that, in either of FIGS. 6A and 6B, since the P-channel MOS transistor M7 or M8 is turned OFF, no reverse current flows therethrough.

Figure 7:
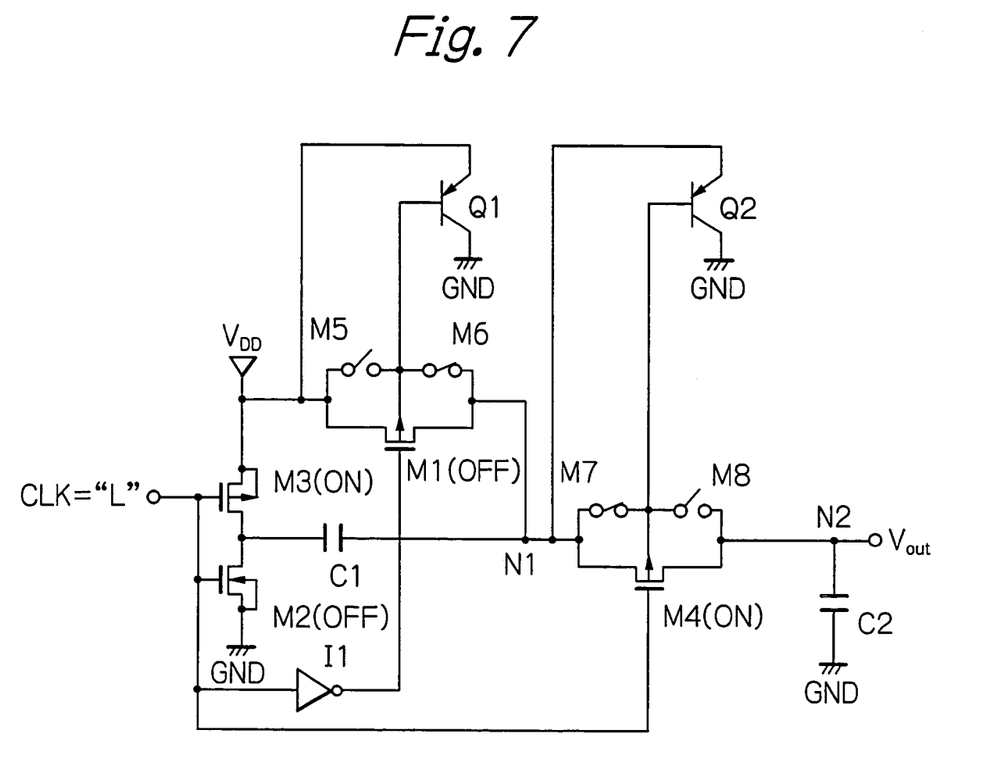
FIG. 7 is a circuit diagram for explaining the discharging (step-up) operation of the charge pump circuit of FIG. 5.

In a discharging (step-up) mode where the clock signal CLK is low (="0") as shown in FIG. 7, the MOS transistors M3 and M4 are turned ON, so that the step-up capacitor C1 is discharged. In this case, since the clock signal CLK is low (="0"), the output signal of the NAND circuit G is low (="0") regardless of whether or not the output signal of the comparator CP is high (="1"). Therefore, the clock signal CLK (="0") is supplied to the gate of the P-channel MOS transistor M7 so that the P-channel MOS transistor M7 is turned ON as shown in FIG. 7. Simultaneously, the inverted signal (="1") of the clock signal CLK is supplied to the gate of the P-channel MOS transistor M8 so that the P-channel MOS transistor M8 is turned OFF as shown in FIG. 7. Therefore, since the base voltage of the parasitic PNP-type transistor Q2 is made equivalent to the emitter voltage thereof (the voltage at the node N1), the parasitic PNP-type transistor Q2 is turned OFF, so that no invalid current flows therethrough.

Note that, in FIG. 7, since the P-channel MOS transistors M5 and M8 are turned OFF, no reverse current flows therethrough.

Figure 8:
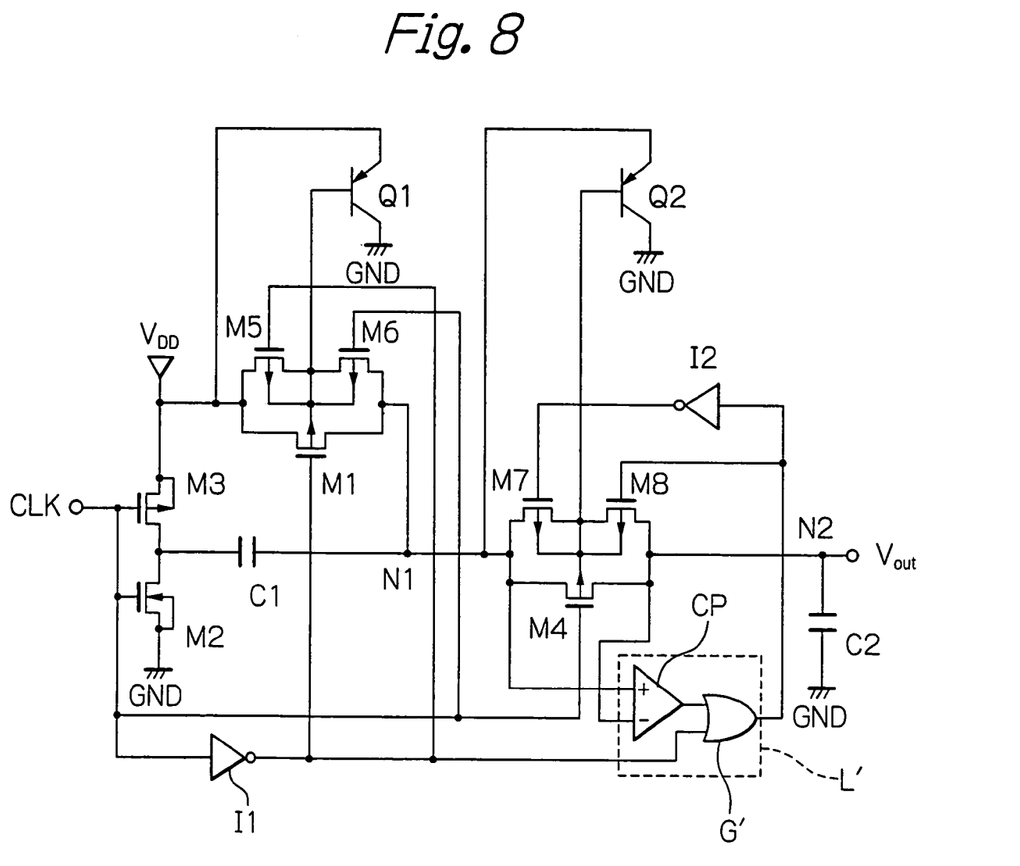
FIG. 8 is a circuit diagram illustrating a modification of the charge pump circuit of FIG. 5.

In FIG. 8, which illustrates a modification of the charge pump circuit of FIG. 5, a logic circuit L' formed by a comparator CP and an OR circuit G' is provided instead of the logic circuit L of FIG. 5. The output signal at the comparator CP and the inverted signal of the clock signal CLK via the inverter I1 are supplied to the OR circuit G'. Therefore, since the logic circuit L' operates in the same way as the logic circuit L of FIG. 5, the charge pump circuit of FIG. 8 operates in the same way as the charge pump circuit of FIG. 5.

Figure 9:
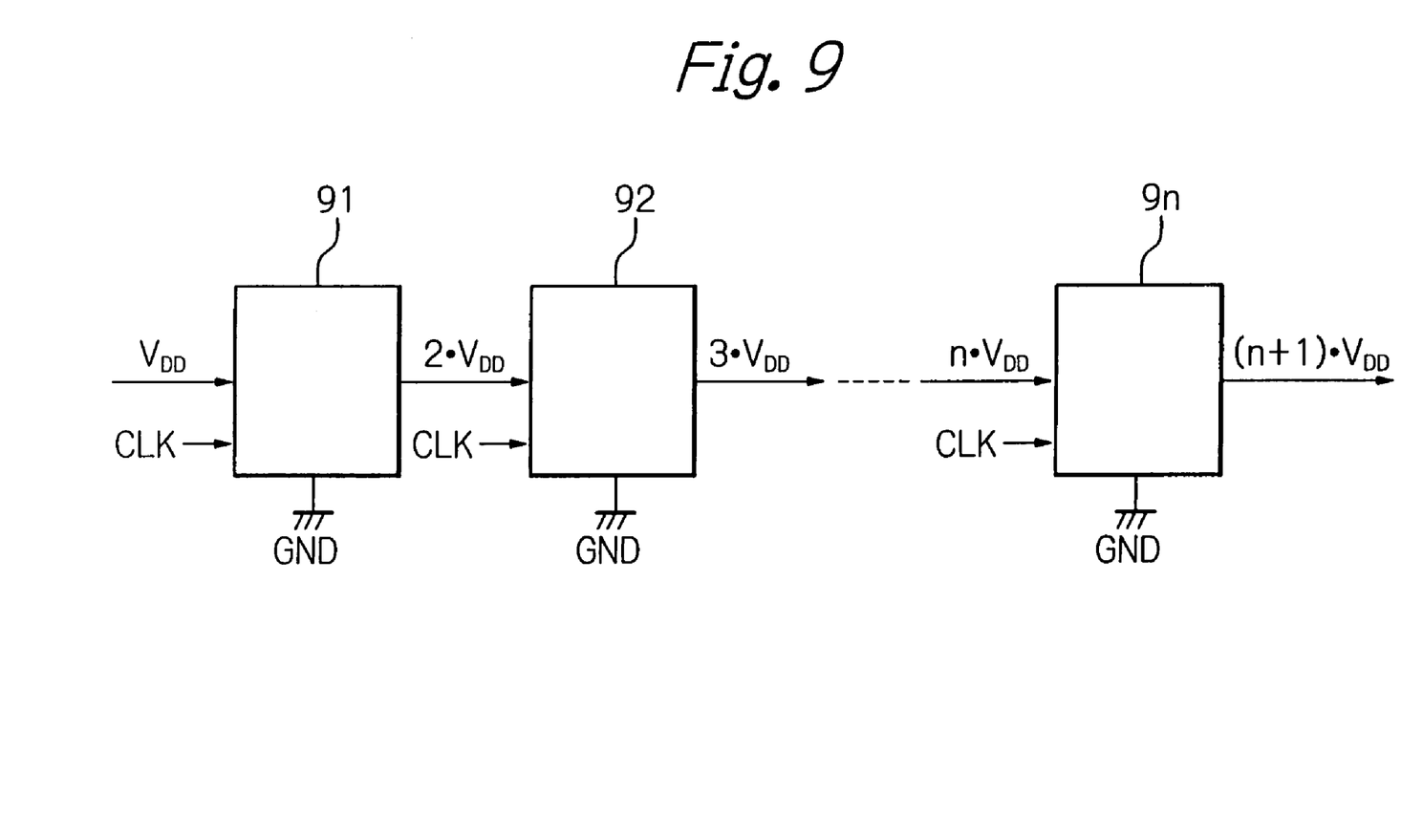
FIG. 9 is a block circuit diagram illustrating an (n+1)-multiple step-up charge pump circuit to which the charge pump circuits of FIGS. 2, 5 and 8 are applied.

In the above-described embodiments, a 2-multiple step-up type charge pump circuit is illustrated; however, the present invention can be applied to other-multiple step-up type charge pump circuits. For example, if a voltage of $n \cdot V_{DD}$ is applied to the power supply terminal $V_{DD}$ of FIG. 2, 5 or 8, a voltage of $(n+1) \cdot V_{DD}$ is obtained at the node N2. Therefore, as illustrated in FIG. 9, if charge pump circuits 91, 92, . . . , 9n are connected in series, a (n+1)-multiple step-up charge pump circuit can be obtained. In this case, the power supply terminal of each of the circuits 91, 92, . . . , 9n receives an input voltage $V_{DD}$, $2 \cdot V_{DD}$, . . . , or $n \cdot V_{DD}$.

As explained hereinabove, according to the present invention, since no invalid currents flow through the parasitic transistors, the efficiency of the charge pump circuit can be enhanced.

The invention claimed is:

1. A charge pump circuit comprising:
   an input voltage receiving terminal;
   a power supply terminal whose voltage is lower than that of said input voltage receiving terminal;
   an output terminal;
   a step-up capacitor having first and second terminals;
   a first charging switching element formed by a first transistor connected between said input voltage receiving terminal and the first terminal of said step-up capacitor;
   a second charging switching element connected between the second terminal of said step-up capacitor and said power supply terminal;
   a first discharging switching element connected between said input voltage receiving terminal and the second terminal of said step-up capacitor;
   a second discharging switching element formed by a second transistor connected between the first terminal of said step-up capacitor and said output terminal;
   a first switch circuit connected between said input voltage receiving terminal and a back gate of said first transistor and between the first terminal of said step-up capacitor and the back gate of said first transistor;
   a second switch circuit connected between the first terminal of said step-up capacitor and a back gate of said second transistor and between said output terminal and the back gate of said second transistor; and
   a logic circuit which compares a voltage at the first terminal of said step-up capacitor with an output voltage at said output terminal to control said second switch circuit in accordance with whether or not said output voltage is lower than the voltage at the first terminal of said step-up capacitor, when said first and second charging elements are turned ON.

2. The charge pump circuit as set forth in claim 1, wherein said first switch circuit comprises:
   a third transistor connected between said input voltage receiving terminal and the back gate of said first transistor; and
   a fourth transistor connected between the first terminal of said step-up capacitor and the back gate of said first transistor, and
   wherein said second switch circuit comprises:

a fifth transistor connected between the first terminal of said step-up capacitor and the back gate of said second transistor; and a sixth transistor connected between said output terminal and the back gate of said second transistor, said third and sixth transistors being turned ON when said first and second charging switching elements are turned ON, said fourth and fifth transistors being turned ON when said first and second discharging switching elements are turned ON.

3. The charge pump circuit as set forth in claim 1, wherein said logic circuit operates said second switch circuit so that said second switch circuit electrically connects the back gate of said second transistor to the first terminal of said step-up capacitor when said output voltage is lower than the voltage at the first terminal of said step-up capacitor, and said second switch circuit electrically connects the back gate of said second transistor to said output terminal when said output voltage is not lower than the voltage at the first terminal of said step-up capacitor.

4. The charge pump circuit as set forth in claim 2, wherein said logic circuit compares a voltage at the first terminal of said step-up capacitor with an output voltage at said output terminal to control said fifth and sixth transistors in accordance with whether or not said output voltage is lower than the voltage at the first terminal of said step-up capacitor, when said first and second charging elements are turned ON.

5. The charge pump circuit as set forth in claim 4, wherein said logic circuit turns ON said fifth transistor when said output voltage is lower than the voltage at the first terminal of said step-up capacitor and turns ON said sixth transistor when said output voltage is not lower than the voltage at the first terminal of said step-up capacitor.

6. The charge pump-circuit as set forth in claim 1, wherein said second charging switching element comprises a transistor, having a conductivity type opposite that of said first transistor, and said first discharging switching element comprises a seventh transistor.

7. The charge pump circuit as set forth in claim 1, wherein said power supply terminal comprises a ground terminal.

8. A charge pump circuit comprising:
an input voltage receiving terminal;
a power supply terminal whose voltage is lower than that of said input voltage receiving terminal;
an output terminal;
a step-up capacitor having first and second terminals;
a first charging switching element formed by a first P-channel MOS transistor connected between said input voltage receiving terminal and the first terminal of said step-up capacitor;
a second charging switching element connected between the second terminal of said step-up capacitor and said power supply terminal;
a first discharging switching element connected between said input voltage receiving terminal and the second terminal of said step-up capacitor;
a second discharging switching element formed by a second P-channel MOS transistor connected between the first terminal of said step-up capacitor and said output terminal;
a first switch circuit connected between said input voltage receiving terminal and a back gate of said first P-channel MOS transistor and between the first terminal of said step-up capacitor and the back gate of said first P-channel MOS transistor;

a second switch circuit connected between the first terminal of said step-up capacitor and a back gate of said second P-channel MOS transistor and between said output terminal and the back gate of said second P-channel MOS transistor; and a logic circuit which compares a voltage at the first terminal of said step-up capacitor with an output voltage at said output terminal to control said second switch circuit in accordance with whether or not said output voltage is lower than the voltage at the first terminal of said step-up capacitor, when said first and second charging elements are turned ON, said first and second charging switching elements being turned ON by a first state of a clock signal, said first and second discharging switching element being turned ON by a second state of said clock signal, wherein, when said clock signal indicates said first state, said first switch circuit electrically connects the back gate of said first P-channel MOS transistor to said input voltage receiving terminal and said second switch circuit electrically connects the back gate of said second P-channel MOS transistor to said output terminal, and wherein, when said clock signal indicates said second state, said first switch circuit electrically connects the back gate of said first P-channel MOS transistor to the first terminal of said step-up capacitor and said second switch circuit electrically connects the back gate of said second P-channel MOS transistor to the first terminal of said step-up capacitor.

9. The charge pump circuit as set forth in claim 8, wherein said first switch circuit comprises:
a third P-channel MOS transistor connected between said input voltage receiving terminal and the back gate of said first P-channel MOS transistor; and
a fourth P-channel MOS transistor connected between the first terminal of said step-up capacitor and the back gate of said first P-channel MOS transistor, and wherein said second switch circuit comprises:
a fifth P-channel MOS transistor connected between the first terminal of said step-up capacitor and the back gate of said second P-channel MOS transistor; and
a sixth P-channel MOS transistor connected between said output terminal and the back gate of said second P-channel MOS transistor, said third and sixth P-channel MOS transistors being turned ON by said first state of said clock signal,
said fourth and fifth P-channel MOS transistors being turned ON by said second state of said clock signal.

10. The charge pump circuit as set forth in claim 8, wherein said logic circuit operates said second switch circuit so that said second switch circuit electrically connects the back gate of said second P-channel MOS transistor to the first terminal of said step-up capacitor when said output voltage is lower than the voltage at the first terminal of said step-up capacitor and said second switch circuit electrically connects the back gate of said second P-channel MOS transistor to said output terminal when said output voltage is not lower than the voltage at the first terminal of said step-up capacitor.

11. The charge pump circuit as set forth in claim 8, wherein said logic circuit comprises:
a comparator which compares the voltage at the first terminal of said step-up capacitor with said output voltage;
a NAND circuit which receives an output signal of said comparator and said clock signal; and an inverter connected to said NAND circuit,
said second switch circuit being controlled by an output signal of said inverter and an output signal of said NAND circuit.

12. The charge pump circuit as set forth in claim 8, wherein said logic circuit comprises:
 a comparator which compares the voltage at the first terminal of said step-up capacitor with said output voltage;
 an OR circuit which receives an output signal of said comparator and an inverted signal of said clock signal; and
 an inverter connected to said OR circuit,
 said second switch circuit being controlled by an output signal of said inverter and an output signal of said OR circuit.

13. The charging pump circuit as set forth in claim 9, wherein said logic circuit compares a voltage at the first terminal of said step-up capacitor with an output voltage at said output terminal to control said fifth and sixth P-channel MOS transistors in accordance with whether or not said output voltage is lower than the voltage at the first terminal of said step-up capacitor, when said clock signal indicates said first state.

14. The charge pump circuit as set forth in claim 13, wherein said logic circuit turns ON said fifth P-channel MOS transistor when said output voltage is lower than the voltage at the first terminal of said step-up capacitor and turns ON said sixth P-channel MOS transistor when said output voltage is not lower than the voltage at the first terminal of said step-up capacitor.

15. The charge pump circuit as set forth in claim 13, wherein said logic circuit comprises:

a comparator which compares the voltage at the first terminal of said step-up capacitor with said output voltage;
 a NAND circuit which receives an output signal of said comparator and said clock signal; and
 an inverter connected to said NAND circuit,
 said fifth P-channel MOS transistor being controlled by an output signal of said inverter,
 said sixth P-channel MOS transistor being controlled by an output signal of said NAND circuit.

16. The charge pump circuit as set forth in claim 13, wherein said logic circuit comprises:
 a comparator which compares the voltage at the first terminal of said step-up capacitor with said output voltage;
 an OR circuit which receives an output signal of said comparator and an inverted signal of said clock signal; and
 an inverter connected to said OR circuit,
 said fifth P-channel MOS transistor being controlled by an output signal of said inverter,
 said sixth P-channel MOS transistor being controlled by an output signal of said OR circuit.

17. The charge pump circuit as set forth in claim 8, wherein said second charging switching element comprises an N-channel MOS transistor, and said first discharging switching element comprises a seventh P-channel MOS transistor.

18. The charge pump circuit as set forth in claim 8, wherein said power supply terminal comprises a ground terminal.

* * * * *